United States Patent
Nakamura et al.

(10) Patent No.: US 8,261,135 B2
(45) Date of Patent: Sep. 4, 2012

(54) INTERLEAVING METHOD AND COMMUNICATION DEVICE

(75) Inventors: Takahiko Nakamura, Tokyo (JP); Hideo Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 194 days.

(21) Appl. No.: 12/158,066

(22) PCT Filed: Mar. 24, 2006

(86) PCT No.: PCT/JP2006/305996
§ 371 (c)(1),
(2), (4) Date: Jun. 19, 2008

(87) PCT Pub. No.: WO2007/110901
PCT Pub. Date: Oct. 4, 2007

(65) Prior Publication Data
US 2009/0164866 A1 Jun. 25, 2009

(51) Int. Cl.
*G11C 29/00* (2006.01)
*H03M 13/00* (2006.01)

(52) U.S. Cl. ........................... 714/702; 714/784

(58) Field of Classification Search .......... 714/701, 714/702, 704, 746, 752, 759, 784, 786, 758, 714/762, 788, 756, 776, 751
See application file for complete search history.

(56) References Cited

U.S. PATENT DOCUMENTS

| | | | |
|---|---|---|---|
| 6,151,296 A | 11/2000 | Vijayan et al. | |
| 6,421,333 B1 | 7/2002 | Jalali | |
| 6,594,793 B1 * | 7/2003 | Guey | 714/776 |
| 6,826,722 B2 * | 11/2004 | Miyauchi et al. | 714/752 |
| 6,925,588 B2 * | 8/2005 | Grimes et al. | 714/712 |
| 7,028,230 B2 * | 4/2006 | Manninen et al. | 714/702 |
| 7,200,792 B2 * | 4/2007 | Kim et al. | 714/755 |
| 7,490,282 B2 * | 2/2009 | Spencer et al. | 714/755 |
| 7,526,687 B2 * | 4/2009 | Eroz et al. | 714/701 |
| 7,657,797 B2 * | 2/2010 | Eroz et al. | 714/701 |
| 7,782,973 B2 * | 8/2010 | Kim et al. | 375/295 |

(Continued)

FOREIGN PATENT DOCUMENTS
JP 2001-136497 5/2001
(Continued)

OTHER PUBLICATIONS

"Performance Evaluation of the Enhanced Symbol Mapping Method Based on Priority (SMP) in HSDPA", 3GPP TSG-RAN WG1 Meeting #20, XP002238300, May 21, 2001, 7 pages.

(Continued)

*Primary Examiner* — Phung M Chung
(74) *Attorney, Agent, or Firm* — Oblon, Spivak, McClelland, Maier & Neustadt, L.L.P.

(57) ABSTRACT

A communication device which includes an error correction encoder that generates an error correction encoded sequence. Additionally, there is an interleaver that arranges elements of the error correction encoded sequence generated by the error correction encoder. The interleaver arranges elements of the error correction encoded sequence in an order which is a same order as an order of the elements in the error correction encoded sequence, when the one of the error correction methods is a predetermined method. Further, the interleaver arranges elements of the error correction encoded sequence in an order different from the order of the elements in the error correction encoded sequence, when the one of the error correction methods is not the predetermined method.

4 Claims, 4 Drawing Sheets

U.S. PATENT DOCUMENTS

| | | | |
|---|---|---|---|
| 7,958,426 B2 * | 6/2011 | Betts | 714/755 |
| 8,069,388 B2 * | 11/2011 | Betts | 714/755 |
| 2005/0190766 A1 | 9/2005 | Ochiai | |
| 2006/0182199 A1 * | 8/2006 | Hong et al. | 375/299 |
| 2007/0223390 A1 | 9/2007 | Kobayashi et al. | |

FOREIGN PATENT DOCUMENTS

| | | |
|---|---|---|
| JP | 2001-197034 | 7/2001 |
| JP | 2001 285080 | 10/2001 |
| JP | 2002 64579 | 2/2002 |
| JP | 2002 217860 | 8/2002 |
| JP | 2003 23373 | 1/2003 |
| JP | 2003-304510 | 10/2003 |
| JP | 2005 508595 | 3/2005 |
| JP | 2005-209286 | 8/2005 |
| JP | 2005-210708 | 8/2005 |

OTHER PUBLICATIONS

Henrik Schulze, et al., "Theory and Applications of OFDM and CDMA: Wideband Wireless Communications", John Wiley & Sons, Ltd., XP002527270, 2005, pp. 145-264.

Japanese Office Action for JP 2008-507282, dated Mar. 22, 2011, with partial English translation.

Japanese Office Action dated Apr. 3, 2012 for Japanese Patent Application No. 2010-218548 (filed Mar. 24, 2006).

* cited by examiner

FIG.2

→ Read

| 1 | C+1 | | RC-C+1 |
|---|-----|---|--------|
| 2 | C+2 | | RC-C+2 |
| 3 | C+3 | | RC-C+3 |
| | | | |
| C-1 | | | RC-1 |
| C | 2C | | RC |

Write ↓

FIG.4
256QAM
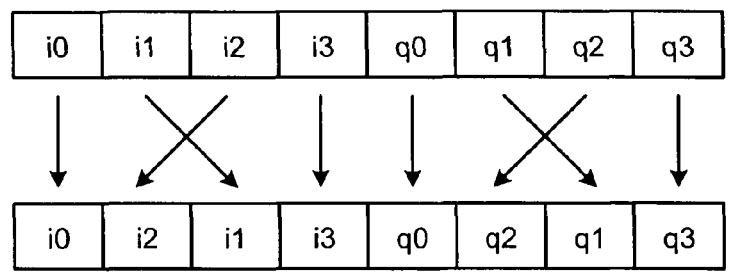
1024QAM
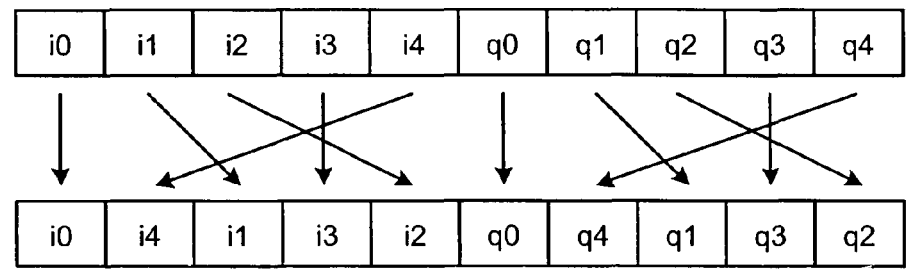

INTERLEAVING METHOD AND COMMUNICATION DEVICE

TECHNICAL FIELD

The present invention relates to an interleaving method, an interleaver, and a communication device that performs interleaving on a sequence after being encoded.

BACKGROUND ART

A conventional interleaving method is described in below-mentioned Patent document 1. For example, when a concatenated code of an RS code and a convolutional code is used as an error-correcting code, a communication device that transmits a signal by using OFDM (Orthogonal Frequency Division Multiplexing) subjects a received signal to FFT, performs frequency deinterleaving on the received signal, and further performs time deinterleaving on the frequency-deinterleaved signal. Information for I axis and information for Q axis after the time deinterleaving is performed are demapped into information for the number of modulation points according to a modulation method. It is noted that the modulation method is previously specified for each block formed of n numbers of carriers of one OFDM symbol, and that the demapping is performed for each segmented block.

The demapped information is divided into a plurality of layers, and bit deinterleaving is performed on the respective layers to improve error resilience in the convolutional code. Thereafter, convolutional decoding is performed thereon. Then, the result of convolutional decoding is divided into a plurality of layers, and a byte deinterleaving process is performed on the respective layers to improve error resilience in the RS code. Further, an RS decoding process is performed on a byte-deinterleaved sequence and the result of decoding is output.

Patent document 1: Japanese Patent Application Laid-open No. 2002-217860

DISCLOSURE OF INVENTION

Problem to Be Solved by the Invention

In the conventional interleaving method, four-stage interleaving processes are performed, such as frequency interleaving, time interleaving, bit interleaving, and byte interleaving. Generally, when an interleaver is formed, a capacity required for a storage unit used to rearrange an order of the processes is increased, which causes a circuit scale to increase. Moreover, the interleaving processes cause processing delay to increase.

When the concatenated code as shown in Patent document 1 is used upon transmission of control information or the like, a large number of redundancy bits is required. Therefore, a plurality of OFDM symbols is required to transmit the information, which causes transmission efficiency to be decreased. Furthermore, when interleaving is performed within the OFDM symbol and if there is a larger number of modulation points, the number of bits to be interleaved becomes large, and required memory capacity thereby increases.

The present invention has been achieved to solve the conventional problem, and an object of the present invention is to obtain a communication device which is capable of improving the transmission efficiency by making error correction effectively work.

Means for Solving Problem

The present invention includes a communication device comprising an error correction encoder that generates an error correction encoded sequence. Additionally, there is an interleaver that arranges elements of the error correction encoded sequence generated by the error correction encoder. The interleaver arranges elements of the error correction encoded sequence in an order which is a same order as an order of the elements in the error correction encoded sequence, when the one of the error correction methods is a predetermined method. Further, the interleaver arranges elements of the error correction encoded sequence in an order different from the order of the elements in the error correction encoded sequence, when the one of the error correction methods is not the predetermined method.

BRIEF DESCRIPTION OF DRAWINGS

FIG. 2 is a schematic of an example of a case where a modulation method is read from a modulation table;

FIG. 4 is a schematic of one examples of rearrangement of signals.

EXPLANATIONS OF LETTERS OR NUMERALS

1 CRC addition unit (CRC addition)
2 Scramble unit (Scramble)
3 RS encoder (RS Encode)
4 Convolutional encoder (Conv. Encode)
5 Inner-carrier bit interleaver (Bit INT.)
6 Inter-carrier interleaver (Carrier INT.)
7 Modulator (MOD.)
8 Modulation table (MOD. Table)
9 Demodulator (DEM.)
10 Inter-carrier deinterleaver (Carrier DINT.)
11 Bit deinterleaver (Bit DINT.)
12 Convolutional code decoder (Conv. Decode)
13 RS code decoder (RS decode)
14 Descramble unit (De-scramble)
15 CRC check unit (CRC)
16 Demodulation table (DEM Table)

BEST MODE(S) FOR CARRYING OUT THE INVENTION

Exemplary embodiments of the interleaving method and the communication device according to the present invention are explained in detail below with reference to the accompanying drawings. It is noted that the present invention is not limited by these embodiments.

First Embodiment

Figure 1:
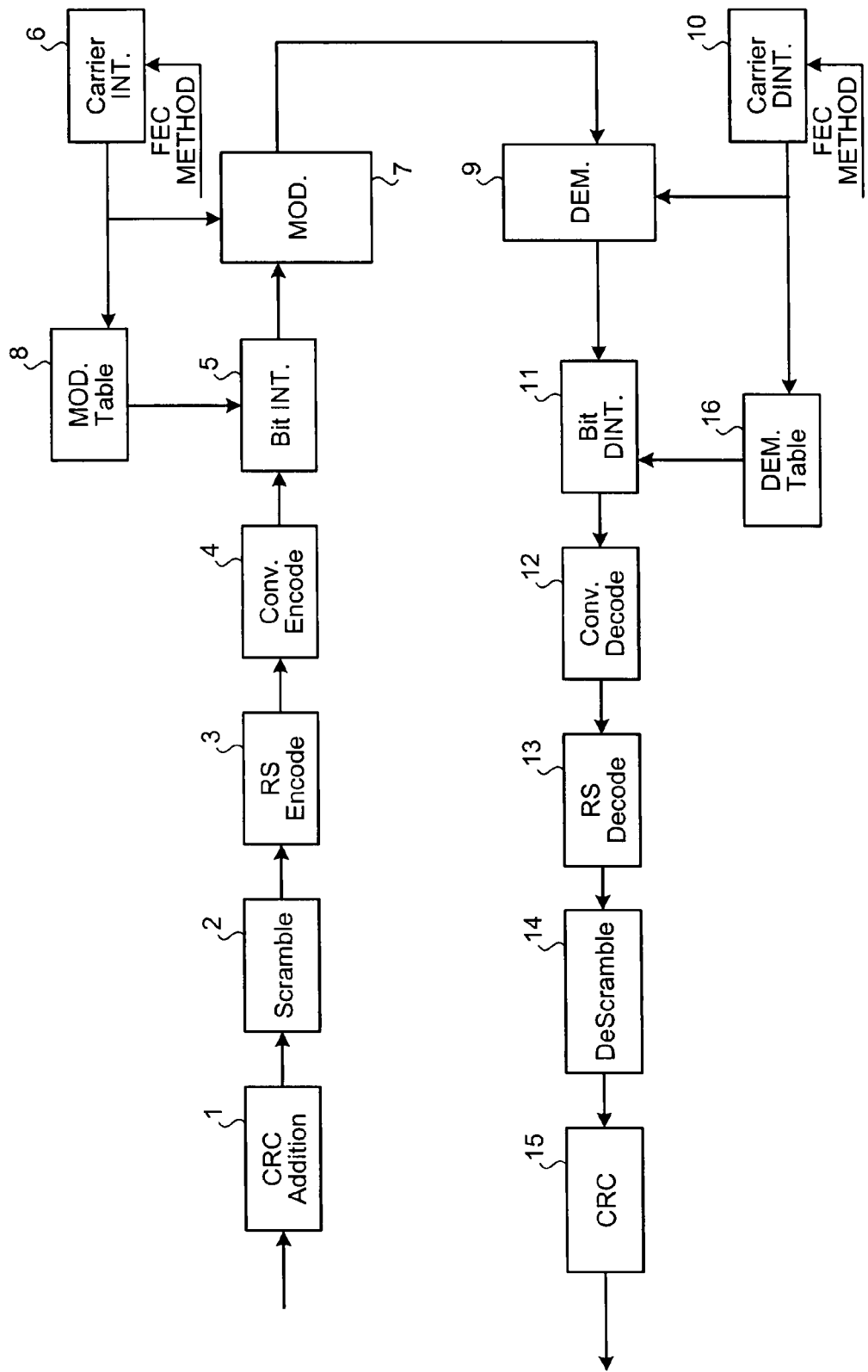
FIG. 1 is a diagram of a configuration example of a communication system (a transmission-side communication device and a reception-side communication device) that implements the interleaving method according to the present invention.

FIG. 1 is a diagram of a configuration example of a communication system (a transmission-side communication device and a reception-side communication device) that implements the interleaving method according to the present invention. The transmission-side communication device includes a CRC addition unit (CRC addition) 1, a scramble unit (Scramble) 2, an RS encoder (RS Encode) 3, a convolutional encoder (Conv. Encode) 4, an inner-carrier bit interleaver (Bit INT.) 5, an inter-carrier interleaver (Carrier INT.) 6, a modulator (MOD.) 7, and a modulation table (MOD.

Table) 8 that stores therein a modulation method for each carrier. The reception-side communication device includes a demodulator (DEM.) 9, an inter-carrier deinterleaver (Carrier DINT.) 10, a bit deinterleaver (Bit DINT.) 11, a convolutional code decoder (Conv. Decode) 12, an RS code decoder (RS decode) 13, a descramble unit (De-scramble), a CRC check unit (CRC) 15, and a demodulation table (DEM Table) 16 that stores therein a modulation method for each carrier (which is the same content as that of the modulation table 8).

The operation of the communication system is explained below. At first, the CRC addition unit 1 adds a CRC check bit to a data sequence input from MAC, and further, the scramble unit 2 performs scrambling on the data sequence after addition of the CRC check bit thereto by adding a PN sequence thereto.

Next, the RS encoder 3 separates the data sequence after being scrambled for information of a channel to be RS-encoded, by each preset length of information symbol, and RS encoding is performed. And, a generated RS check bit is added to information bit after being scrambled and is output. If the RS encoding is not performed, then the RS encoder 3 outputs the scrambled data sequence as it is.

Then, the convolutional encoder 4 encodes information of a channel to be convolutional-encoded at a preset encoding ratio. If the convolutional encoding is not performed, then the convolutional encoder 4 outputs the data output from the RS encoder 3 as it is.

Next, the inter-carrier interleaver 6 rearranges the order of carrier numbers according to an error correction method, searches for a modulation method from the modulation table 8 in the rearranged order, and separates the sequence after being encoded by each number of bits corresponding to each modulation method. The method of rearranging the order includes, for example, sequential allocation of the encoded sequence to carriers at a predetermined interval.

The inner-carrier bit interleaver 5 rearranges the order by each number of bits separated according to the modulation method. The rearrangement of the order is assumed to be preset. Lastly, the modulator 7 converts each carrier into information for I axis and information for Q axis according to the modulation method specified in the modulation table 8, and stores the carrier number as an address in an internal memory. Then the result of FFT operation is transmitted.

Next, in the reception side, the demodulator 9 performs IFFT operation, and calculates pieces of information for the I axis and the Q axis for each carrier, to store the result in an internal memory.

The inter-carrier deinterleaver 10 rearranges the order of carrier numbers according to an error correction method in the same manner as that of the inter-carrier interleaver 6, searches for a modulation method from the demodulation table 16 in the rearranged order, and generates soft-decision information for each number of bits corresponding to each modulation method.

The inner-carrier bit deinterleaver 11 rearranges the order of pieces of the soft-decision information for each number of bits corresponding to each modulation method, according to the modulation method selected in the demodulation table 16.

Next, the convolutional decoder 12 decodes the sequence, which is convolutional-encoded, by Viterbi decoding or the like based on input soft-decision information. The input soft-decision information for the sequence which is not convolutional-encoded is converted into hard-decision information.

The RS decoder 13 performs RS decoding process on the RS-encoded sequence, and outputs an information bit portion obtained as the result of decoding. As for the sequence which is not RS decoded, the input sequence is output as it is.

Next, the descramble unit 14 adds a PN sequence to the sequence at the same timing as that of the scramble unit 2, and lastly, the CRC check unit 15 detects any error, and outputs the sequence after the CRC check bit is removed.

As explained above, in the present embodiment, the interleaving is formed in two stages, and further the inner-carrier bit interleaver is configured to only rearrange the order of bits in the carrier. With this feature, it is possible to reduce the amount of memory, or to reduce the circuit scale, and further reduction of the interleaving processes allows reduction of the amount of processing delay.

An example of rearranging the order of carrier numbers according to an error correction method by the inter-carrier interleaver 6 is explained below.

In the communication system, for example, when the RS encoding is performed singly, the inter-carrier interleaver 6 generates data in the order of carrier numbers, and rearranges the order of the carrier numbers by a specified number when any other error correction method is used.

By configuring the inter-carrier interleaver 6 in the above manner, even if a burst error occurs in a communication path, inter-carrier interleaving is not performed when the RS encoding is performed singly. Therefore, the errors occurring closely to each other are input to the RS code decoder 13, and thus the effect of the RS decoding is increased.

Furthermore, when the convolutional encoding is included in the encoding process, the errors are distributed by inter-carrier interleaving and deinterleaving, and thus the effect of the convolutional decoding is increased, which leads to improved performance.

More specifically, as shown in FIG. 2, the inter-carrier interleaver 6 reads a modulation method from the modulation table 8 for each c-pieces of carriers of N=RC pieces of carriers. This causes pieces of information for adjacent carriers to be separated from each other on the transmission path, and because of this, even if the status of the transmission path with a specific bandwidth rapidly worsens and this causes an error to occur, the error will be in a state close to a random error by performing deinterleaving, and thus the performance of the convolutional decoding can be improved.

As explained above, in the present embodiment, control can be provided so that error correction effectively works by switching between interleaving methods according to the error correction method, which enables transmission efficiency to be largely improved.

An example of rearrangement of bits by the inner-carrier interleaver 5 is explained below.

Figure 3:
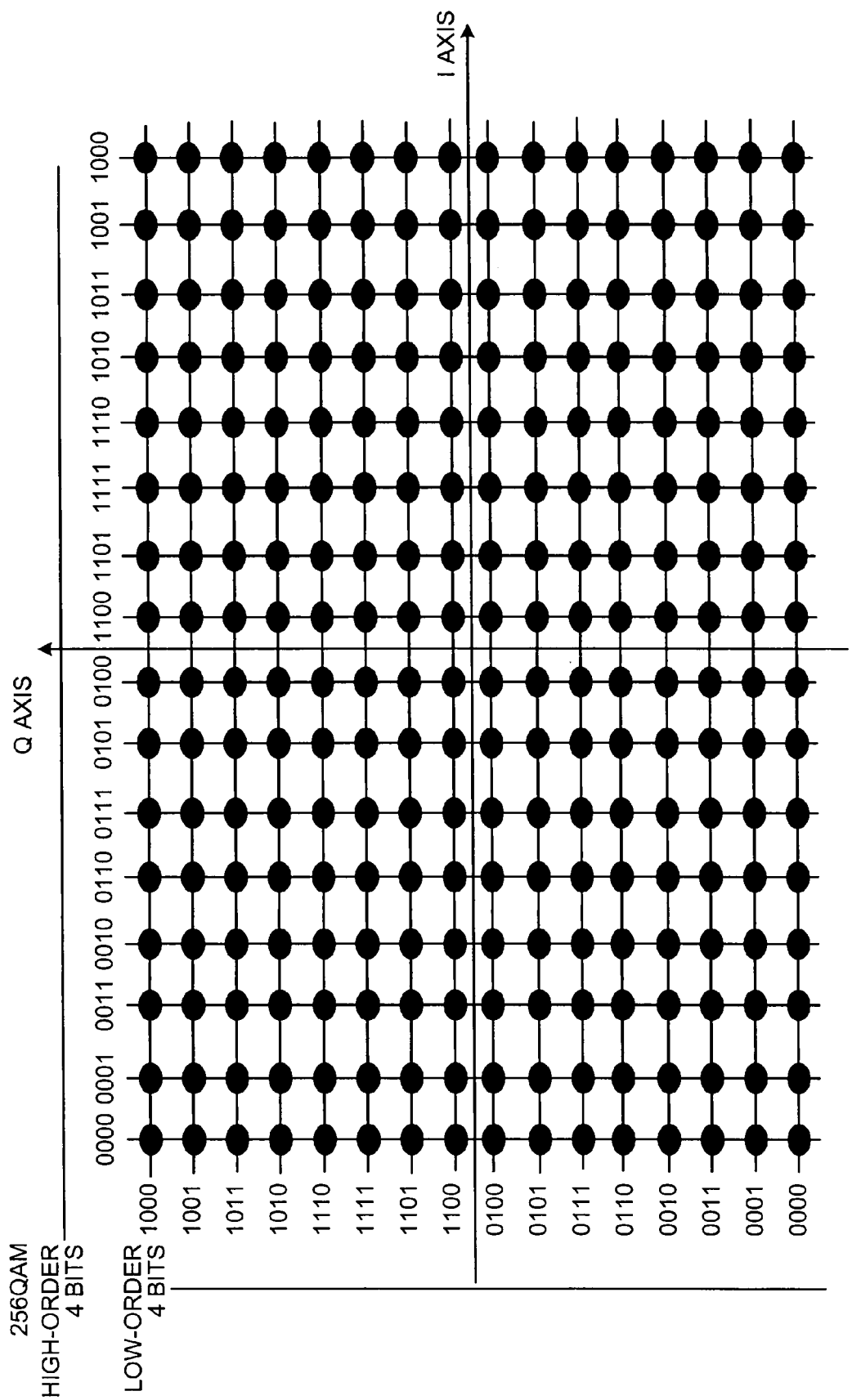
FIG. 3 is a schematic of a signal point constellation when the modulation method is 256 QAM.

In the inner-carrier bit interleaver 5, if the modulation method is BPSK or QPSK, bit error rates are the same as each other, and thus there is no effect due to the bit interleaving. However, if the modulation method is QAM modulation, there is a mixture of bits with a high error rate and bits with a low error rate, and thus favorable effect due to the bit interleaving is obtained. For example, if a modulation method is 256 QAM and a signal point constellation is as shown in FIG. 3, and when signals are arranged as follows, i0, i1, i2, i3, q0, q1, q2, and q3, the error rates from i0 to i3 become i0<i1<i2<i3, while the error rates from q0 to q3 become q0<q1<q2<q3. Because of this, if the signals are transmitted as they are, there will be a high probability that errors may occur continuously.

Therefore, in the present embodiment, by rearranging the order as, for example, i0, i3, i1, i2, q0, q3, q1, and q2 as shown in FIG. 4, the errors do not occur continuously. Thus, decoding performance is improved and transmission efficiency is improved upon performance of convolutional decoding.

Moreover, as the error-correcting code, if the convolutional code is not used but the RS code is singly used and if the modulation method is 256 QAM and the signal point constellation is as shown in FIG. 3, and when signals are arranged as follows, i0, i1, i2, i3, q0, q1, q2, and q3, the error rates from i0 to i3 become i0<i1<i2<i3, while the error rates from q0 to q3 become q0<q1<q2<q3. Because of this, if the signals are transmitted as they are, there will be a high probability that errors may occur continuously.

Therefore, in the present embodiment, by rearranging the order as, for example, i0, q0, i1, q1, i2, q2, i3, and q3, the bits with high error rates are arranged as closely as possible to each other, and the bits with low error rates are thereby arranged closely to each other. Thus, the errors can be collected in a burst manner, which improves the performance.

If each status of the communication paths for carriers largely fluctuates, the present embodiment may be configured to include a modulation table for each carrier. In this case, the corresponding number of bits is extracted from an encoded sequence based on a modulation method obtained by searching the modulation table for each carrier. Then, the order of the extracted bits is rearranged, and the sequence after being rearranged is allocated to the carriers of which order has been rearranged by the inter-carrier interleaving. Accordingly, even if the communication path with a specific bandwidth is in a bad condition, the communication can be efficiently performed.

If a carrier number on which the inter-carrier interleaving is performed has a bandwidth through which data cannot be transferred, the corresponding number of bits is extracted from encoded data based on a modulation method of the next carrier number obtained by searching the modulation table. Then, the extracted encoded data is allocated to corresponding carrier numbers in the same procedure as explained above. Accordingly, even if some other communication device uses a specific bandwidth and the bandwidth cannot thereby be used, the same performance can be obtained.

INDUSTRIAL APPLICABILITY

As explained above, the interleaving method according to the present invention is useful for a communication device that employs, for example, the OFDM method, and particularly suitable for a communication device that uses the concatenated code of the RS code and the convolutional code as the error-correcting code.

The invention claimed is:

1. A communication device, comprising:
an error correction encoder that generates an error correction encoded sequence by performing error correction encoding on a target data sequence based on one of a plurality of error correction methods, and
an interleaver that arranges elements of the error correction encoded sequence generated by the error correction encoder based on an order according to the one of the error correction methods,
wherein
the interleaver arranges elements of the error correction encoded sequence in an order which is a same order as an order of the elements in the error correction encoded sequence, when the one of the error correction methods is a predetermined method, and
the interleaver arranges elements of the error correction encoded sequence in an order different from the order of the elements in the error correction encoded sequence, when the one of the error correction methods is not the predetermined method.

2. An interleaver for arranging elements of an error correction encoded sequence generated by performing error correction encoding on a target data sequence based on an order according to one of a plurality of error correction methods, the interleaver comprising:
a device configured to perform arranging elements of the error correction encoded sequence in an order which is a same order as an order of the elements in the error correction encoded sequence, when the one of the error correction methods is a predetermined method, and configured to perform arranging elements of the error correction encoded sequence in an order different from the order of the elements in the error correction encoded sequence, when the one of the error correction methods is not the predetermined method.

3. An interleaver, comprising:
an input;
a device for arranging elements of an error correction encoded sequence received from the input generated by performing error correction encoding on a target data sequence based on an order according to one of a plurality of error correction methods, and
an output which outputs a result of the arranging,
wherein
the device for arranging performs arranging elements of the error correction encoded sequence in an order which is a same order as an order of the elements in the error correction encoded sequence, when the one of the error correction methods is a predetermined method, and performs arranging elements of the error correction encoded sequence in an order different from the order of the elements in the error correction encoded sequence, when the one of the error correction methods is not the predetermined method.

4. The interleaver according to claim 3, wherein the predetermined method is only Reed-Solomon error correction.

* * * * *